(12) United States Patent
Thiery

(10) Patent No.: US 7,659,577 B2
(45) Date of Patent: Feb. 9, 2010

(54) POWER SEMICONDUCTOR DEVICE WITH CURRENT SENSE CAPABILITY

(75) Inventor: Vincent Thiery, La Roque d'Antheron (FR)

(73) Assignee: International Rectifier Corporation, El Segundo, CA (US)

(*) Notice: Subject to any disclaimer, the term of this patent is extended or adjusted under 35 U.S.C. 154(b) by 357 days.

(21) Appl. No.: 11/477,691

(22) Filed: Jun. 29, 2006

(65) Prior Publication Data

US 2007/0018196 A1 Jan. 25, 2007

Related U.S. Application Data

(60) Provisional application No. 60/696,195, filed on Jul. 1, 2005.

(51) Int. Cl.
*H01L 23/62* (2006.01)

(52) U.S. Cl. .................. 257/335; 257/155; 257/328; 257/577; 257/585; 257/593; 257/E29.027

(58) Field of Classification Search .................. 257/328, 257/585, 593
See application file for complete search history.

(56) References Cited

U.S. PATENT DOCUMENTS

| | | | | |
|---|---|---|---|---|
| 5,821,616 | A * | 10/1998 | Ronsisvalle | 257/688 |
| 5,877,528 | A * | 3/1999 | So | 257/341 |
| 6,180,966 | B1 * | 1/2001 | Kohno et al. | 257/173 |
| 6,268,628 | B1 | 7/2001 | Yoshida et al. | |
| 6,388,280 | B2 * | 5/2002 | Hatade et al. | 257/262 |
| 6,707,103 | B1 * | 3/2004 | Boden et al. | 257/341 |
| 6,936,893 | B2 * | 8/2005 | Tanaka et al. | 257/341 |

* cited by examiner

*Primary Examiner*—Kenneth Parker
*Assistant Examiner*—Jose R Diaz
(74) *Attorney, Agent, or Firm*—Farjami & Farjami LLP

(57) ABSTRACT

A power semiconductor device includes a power device and a current sense device formed in a common semiconductor region.

20 Claims, 3 Drawing Sheets

POWER SEMICONDUCTOR DEVICE WITH CURRENT SENSE CAPABILITY

RELATED APPLICATION

This application is based on and claims benefit of U.S. Provisional Application Ser. No. 60/696,195, filed on Jul. 1, 2005, entitled Current Sense Structure with Second Gate, to which a claim of priority is hereby made and the disclosure of which is incorporated by reference.

BACKGROUND OF THE INVENTION

The present invention relates to power semiconductor devices, and more particularly to a power device that includes a current sense feature.

It is well known to have a current sense feature to determine the current flowing through a power device, for example, a power MOSFET. In a conventional device, the current in the power device is calculated based on a predetermined ratio of the current in the current sense feature and the current in the power device.

Conventional current sense features operate well when the power device is operated in the saturation region. However, it has been observed by the inventor that when the power device is in the linear region, the current sense feature may report the status of the current inaccurately. Specifically, it has been observed that in the linear region the ratio of the current of the current sense (I(sense/linear)) to the current of the main power device is increased relative to the same ratio in the saturation region. This result indicates that the current gain in the linear region for the current sense feature of the device is limited compared to that of the power device itself.

It is believed the reduced gain in the linear region is due to the outer cells of the current sense feature exhibiting a different resistive behavior (e.g. higher resistance) in the linear region thereby causing the discrepancy between the behavior of the device during the linear region and the saturation region. Specifically, it is believed that the discrepancy in behavior may be due to the outer cells of the current sense feature having no corresponding opposing cell, doping diffusion discrepancy, and/or mis-alignment of the outer cells.

SUMMARY OF THE INVENTION

According to the present invention, inactive cells are disposed at the outer active cells of the current sense feature of the power device to overcome the drawbacks of the prior art.

A power semiconductor device according to the present invention includes a power device, for example, a power MOSFET, and a current sense device formed in a semiconductor region. The current sense device includes an active region having a plurality of active cells, each active cell including a base region of another conductivity formed in the semiconductor region, and a conductive region of the one conductivity formed in each base region spaced from the semiconductor region of the one conductivity by a preferably horizontally oriented invertible region of another conductivity, a MOS gate adjacent each invertible region, and a plurality inactive cells of the another conductivity only disposed at the outer boundary of the active region.

Preferably, the active cells are a plurality of spaced stripes arranged in a row and the inactive cells include a first stripe shaped region of the another conductivity adjacent a first one of the active cells and a second stripe shaped region adjacent a last one of the active cells.

Other features and advantages of the present invention will become apparent from the following description of the invention which refers to the accompanying drawings.

DETAILED DESCRIPTION OF EMBODIMENTS OF THE INVENTION

Figure 1:
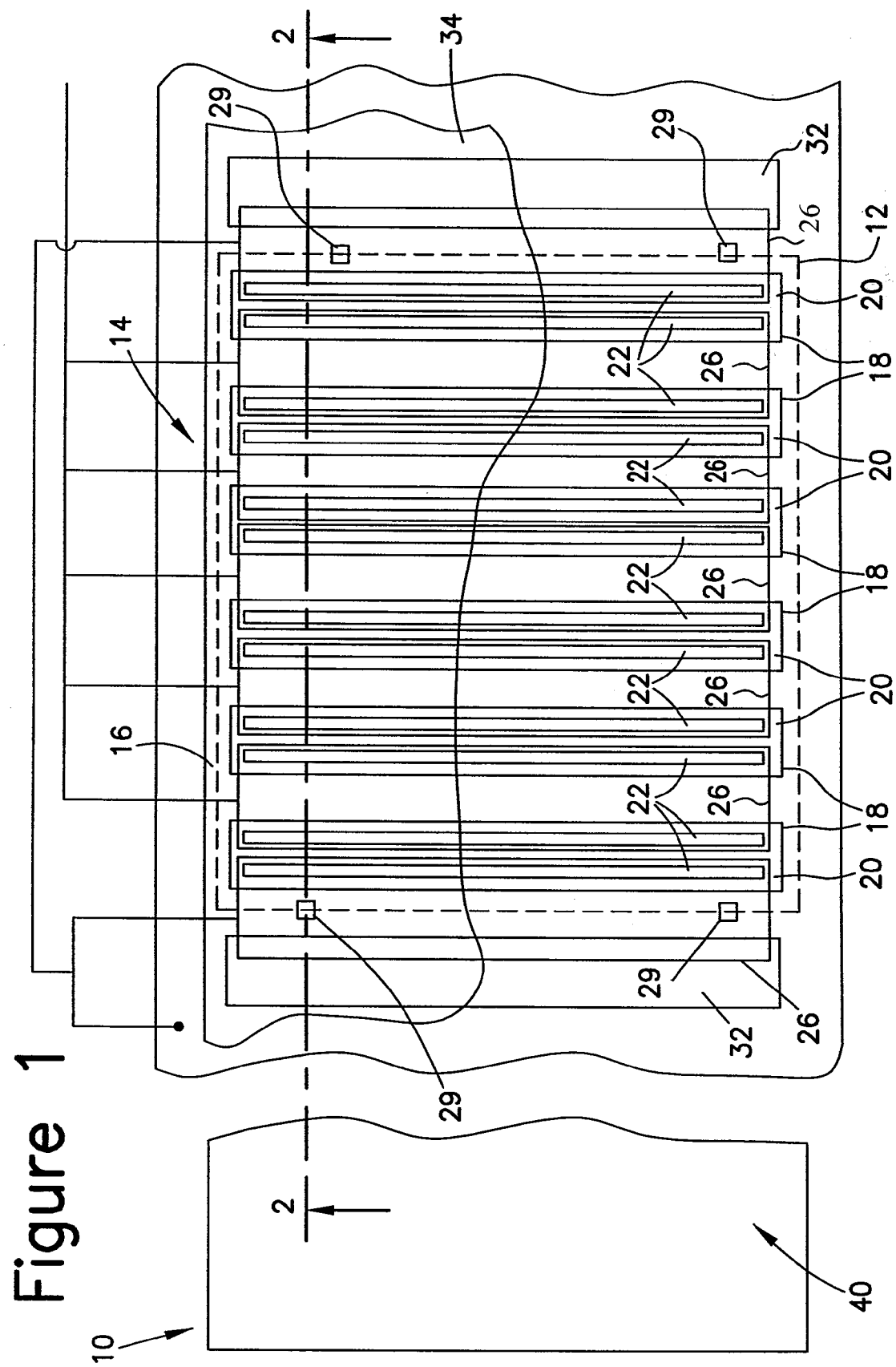
FIG. 1 schematically shows a top plan view of a device according to the first embodiment of the present invention. Note that all features are rendered transparent for better illustration.
Figure 2:
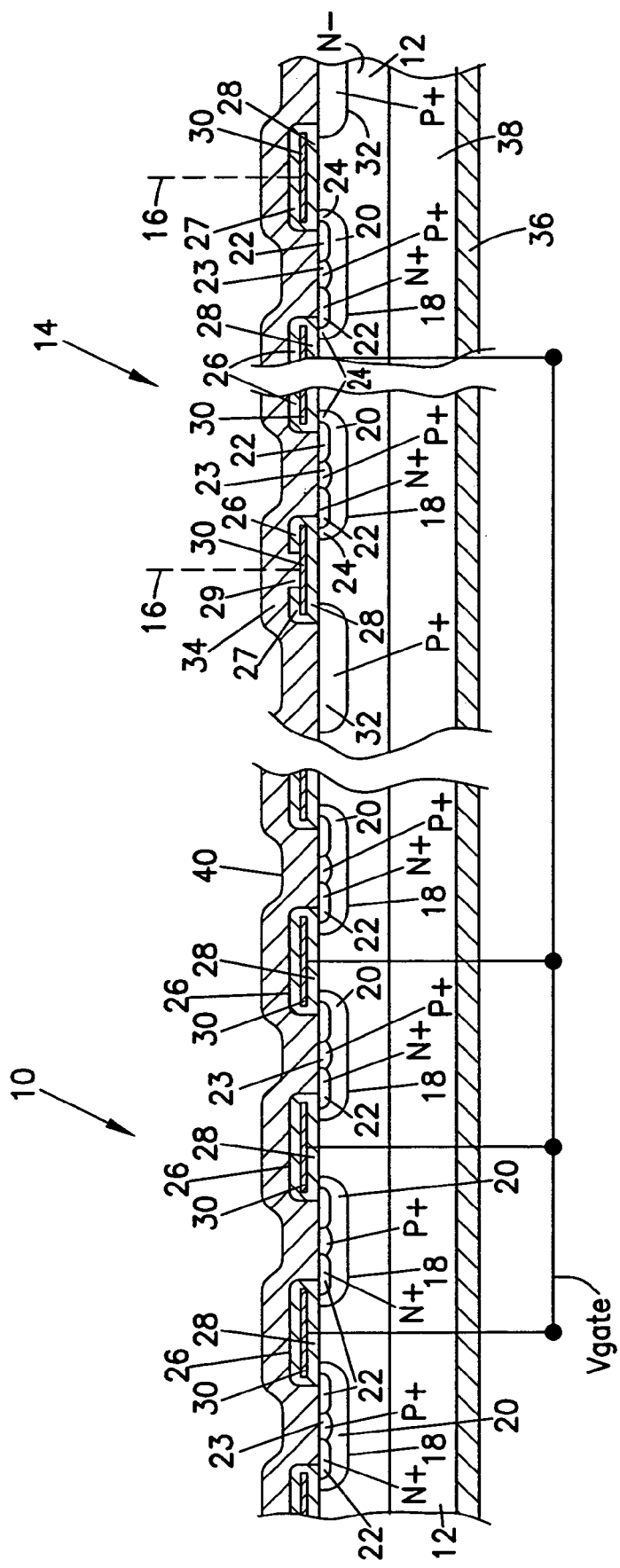
FIG. 2 schematically shows a cross-sectional view of a device according to the present invention along line 2-2 viewed in the direction of the arrows. Note that the gaps in the illustration are not intended to show discontinuity in the device, but are intended only to simplify the illustration by omitting redundant parts already shown.

Referring to FIGS. 1 and 2, a device according to the first embodiment of the present invention includes a power switching device 10 formed in a semiconductor region 12 of one conductivity (e.g. N-type, or P-type), and a current sense device 14 also formed in semiconductor region 12. Current sense device 14 includes an active region 16 having a plurality of active cells 18. Each active cell 18 includes a base region 20 of another conductivity opposite to the conductivity of region 12 (e.g. P-type when region 12 is N-type, and N-type when region 12 is P-type) formed in semiconductor region 12, and a conductive region 22 of the same conductivity as region 12 formed in each base region 20. Note that each conductive region 22 is spaced from semiconductor region 12 by an invertible region 24. Each invertible region 24 can be inverted into the same conductivity as region 12 and conductive region 22, thereby electrically linking the two regions with a channel. In another variety, region 12 and conductive region 22 may be linked with a channel which can be electrically de-linked through inversion. A MOSgate 26 is preferably formed over region 12 whereby it is horizontally oriented, and adjacent one invertible region 24 for the purpose of effecting the inversion as earlier described. Each MOSgate 26 includes a gate insulation 28 and a gate electrode 30.

According to one aspect of the present invention, current sense device 14 includes a plurality of inactive cells 32, each disposed at an outer boundary of active region 16 of current sense device 14. Note that each inactive cell is a diffusion of another conductivity (e.g. N-type when region 12 is P-type) into semiconductor region 12 that does not include a conductive region 22 extending under a MOSgate. Thus, each inactive cell 32 is unable to allow for selective conduction through inversion.

A device according to the present invention, further includes first power electrode 34 (shown only partially covering the device for illustration purposes), which is ohmically connected to conductive regions 22 and highly conductive contact regions 23 (of the same conductivity as base regions 20) each formed in a respective base regions 22 of current sense device 14, and a second power electrode 36, which is ohmically connected to semiconductor substrate 38 on which region 12 is epitaxially formed. Thus, current travels vertically through region 12 and substrate 38. Note that highly conductive contact regions 23 are provided to increase the threshold of the parasitic NPN devices in order to prevent the same from being turned on unexpectedly.

According to another aspect of the present invention, as an option, gate electrode 30 of each MOSgate that is disposed over a respective inactive cell 32 is shorted to first power electrode 34 through preferably openings 29 in insulation 37 of the MOSgate so that Vgs=0V. Thus, according to one aspect of the present invention the current sense device includes a dual gate structure in which gate electrodes associated with active cells are electrically connected together (and to the electrodes of the MOS gates in the power device) while gate electrodes of MOS gates that extend over inactive cells 32 are electrically shorted to electrode 34. MOS gates over inactive cells 32 should be fully isolated from MOS gates over the active cells in order to prevent any gate to source leakage.

According to yet another aspect of the present invention, optionally the polarity of the dopant in each gate electrodes 30 can be selected to increase the threshold. Specifically, the dopant polarity can be selected to be the same as that of base regions 20, and inactive cells 32. For example, in an N-channel device which would have P type base regions, gate electrodes would be doped with P type dopants (P+ doped preferably) instead of the conventionally known N-type dopant. This variation would increase the threshold by one band gap voltage, which allows for compensating the larger ratio when the device is in saturation rather than in the linear mode.

In the preferred embodiment, power device 10 is a power MOSFET; however, it can be an IGBT or any other power device. In FIG. 2, in which like numerals identify like features, the power device is a power MOSFET. Note that, power device 10 includes its own first power electrode 40. Thus, region 12 and second power electrode 38 are shared between power device 10, and current sense device 14.

In the preferred embodiment, active cells 18 are a plurality of stripe-shaped regions spaced from one another and arranged in a row, and one inactive cell 32 is a stripe-shaped region adjacent the first active cell 18, and another inactive cell 32 is a stripe-shaped region adjacent the last active cell 18. Note that preferably, a MOSgate extends over each inactive cell 32.

In the preferred embodiment, current sense device 14 and power device 10 are MOSFETs. Thus, first power electrode 34 is a current sense source electrode, conductive regions 22 are source regions, and second power electrode 36 is a drain electrode.

Further, in the preferred embodiment, region 12 is comprised of N-type epitaxially formed silicon and substrate 38 is an N-type single silicon die.

Figure 3:
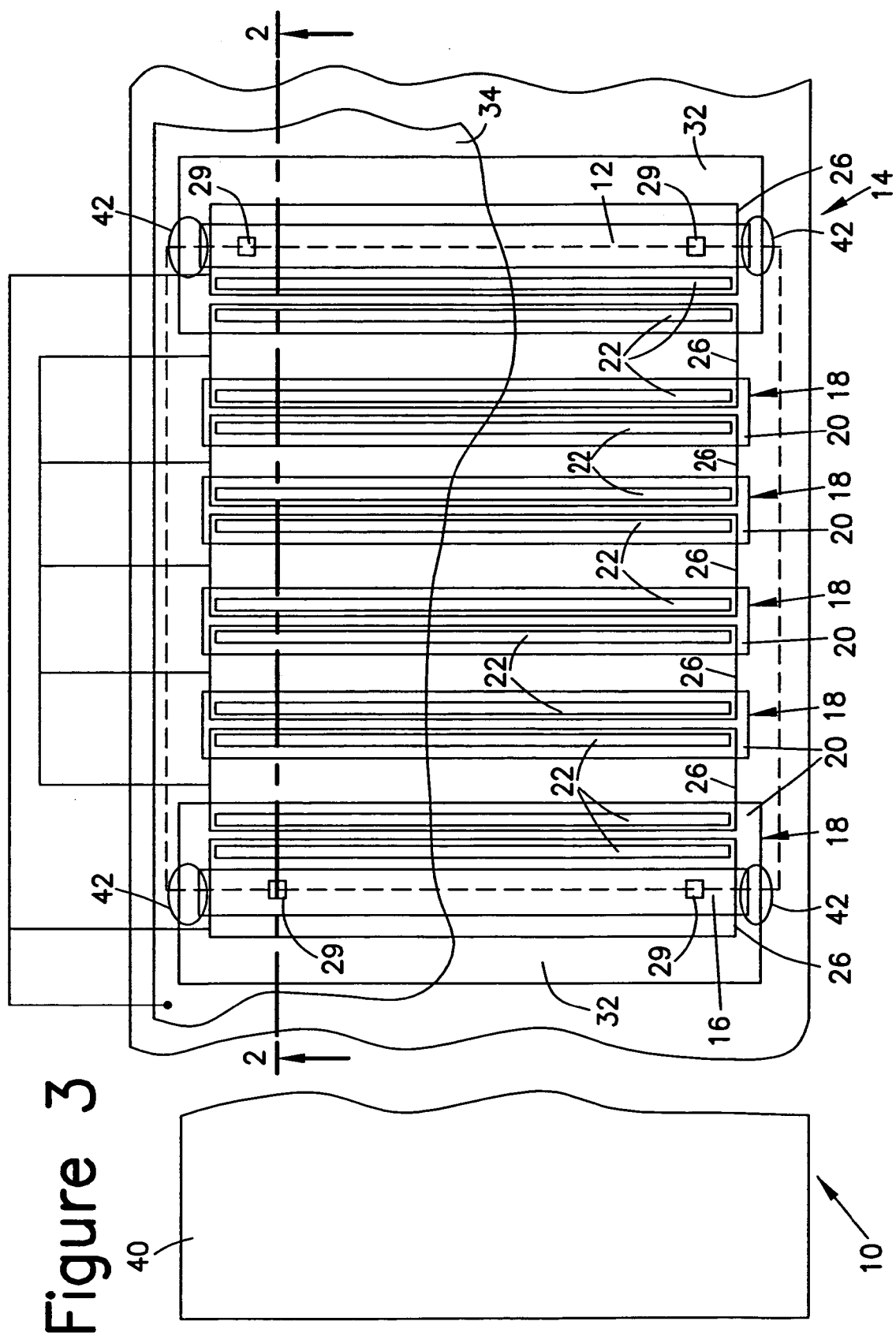
FIG. 3 is a top plan view of a device according to the second embodiment of the present invention. Note that all features are rendered transparent for better illustration.

Referring next to FIG. 3, in a current sense device 14 according to the second embodiment each inactive cell 32 is shorted to a respective active cell 18 through a region of another conductivity 42. Thus, one inactive cell 32 is shorted to the first active cell 18 in the row of active cells and another inactive cell 32 is shorted to the last active cell 18 in the row of active cells.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
    a power device formed in a semiconductor region of one conductivity;
    a current sense device formed in said semiconductor region, said current sense device including,
    a plurality of active cells each including a base region of another conductivity formed in said semiconductor region, and a conductive region of said one conductivity formed in each said base region spaced from said semiconductor region of said one conductivity by an invertible region of said another conductivity;
    a transistor gate adjacent said invertible region;
    a plurality inactive cells of said another conductivity disposed at the outer boundary of said active region; and
    a first power electrode in electrical contact with said conductive region of said one conductivity;
    wherein said transistor gate extends over at least a portion of a respective inactive cell, said transistor gate including a gate electrode which is shorted to said first power electrode, wherein said active cells are a plurality of spaced stripes arranged in a row and said inactive cells include a first stripe shaped region of said another conductivity adjacent a first one of said active cells and a second stripe shaped region adjacent a last one of said active cells.

2. The power semiconductor device of claim 1, wherein said power device is a MOSFET.

3. The power semiconductor device of claim 1, wherein said power device is an IGBT.

4. The power semiconductor device of claim 1, wherein a conductive region of said one conductivity are source regions.

5. The power semiconductor device of claim 1, wherein said transistor gate extends over at least a portion of a respective inactive cell, said transistor gate including a gate electrode having a conductivity as said inactive cell.

6. A power semiconductor device comprising:
    a power device formed in a semiconductor region of one conductivity;
    a current sense device formed in said semiconductor region, said current sense device including,
    an active region having a plurality of active cells, each active cell including a base region of another conductivity formed in said semiconductor region, and a conductive region of said one conductivity formed in each said base region spaced from said semiconductor region of said one conductivity by an invertible region of said another conductivity;
    a transistor gate adjacent said invertible region; and
    a plurality of inactive cells of said another conductivity disposed at the outer boundary of said active region;
    wherein said active cells are a plurality of spaced stripes arranged in a row and said inactive cells include a first stripe shaped region of said another conductivity adjacent a first one of said active cells and a second stripe shaped region adjacent a last one of said active cells.

7. The power semiconductor device of claim 6, wherein said power device is a MOSFET.

8. The power semiconductor device of claim 6, wherein said power device is an IGBT.

9. The power semiconductor device of claim 6, wherein said invertible region is horizontally oriented.

10. The power semiconductor device of claim 6, wherein said conductive region of said one conductivity is a source region.

11. The power semiconductor device of claim 6, further comprising a semiconductor substrate of said one conductivity, said semiconductor region being disposed on said semiconductor substrate and further comprising a second power electrode in electrical contact with said substrate.

12. The power semiconductor device of claim 11, wherein said first power electrode is a source sense electrode and said second power electrode is a drain electrode of said power device and said current sense device.

13. The power semiconductor device of claim 6, wherein said semiconductor region serves as a common conduction region for said power device and said current sense device.

14. The power semiconductor device of claim 6, wherein said transistor gate extends over at least a portion of a respective inactive cell, said transistor gate including a gate electrode having a same conductivity as said inactive cell.

15. The power semiconductor device of claim 6, wherein at least one of said inactive cells is shorted to an active cell through a region of said another conductivity.

16. A power semiconductor device comprising:
   a power device formed in a semiconductor region of one conductivity;
   a current sense device including an active region having a plurality of active cells, each active cell including a base region of an opposite conductivity formed in said semiconductor region, and a conductive region of said one conductivity formed in each said base region spaced apart by an invertible region of said opposite conductivity;
   a transistor gate adjacent said invertible region; and
   a plurality of inactive cells of said opposite conductivity disposed in said active region;
   wherein said active cells are a plurality of spaced stripes arranged in a row and said inactive cells include a first stripe shaped region of said opposite conductivity.

17. The power semiconductor device of claim 16, wherein said power device is a MOSFET.

18. The power semiconductor device of claim 16, wherein said power device is an IGBT.

19. The power semiconductor device of claim 16, wherein said invertible region is horizontally oriented.

20. The power semiconductor device of claim 16, wherein said conductive region of said one conductivity is a source region.

* * * * *

UNITED STATES PATENT AND TRADEMARK OFFICE
CERTIFICATE OF CORRECTION

| | | |
|---|---|---|
| PATENT NO. | : 7,659,577 B2 | |
| APPLICATION NO. | : 11/477691 | |
| DATED | : February 9, 2010 | |
| INVENTOR(S) | : Vincent Thiery | |

It is certified that error appears in the above-identified patent and that said Letters Patent is hereby corrected as shown below:

In the claims, column 4, line 33, "having a conductivity" should be changed to --having a same conductivity--.

Signed and Sealed this
Twenty-second Day of November, 2011

David J. Kappos
*Director of the United States Patent and Trademark Office*